United States Patent
Lee et al.

(10) Patent No.: US 6,881,668 B2
(45) Date of Patent: Apr. 19, 2005

(54) CONTROL OF AIR GAP POSITION IN A DIELECTRIC LAYER

(75) Inventors: Tai-Peng Lee, Milpitas, CA (US); Ching-Yueh Hu, Sunnyvale, CA (US); Chuck Jang, Fremont, CA (US)

(73) Assignee: Mosel Vitel, Inc., Hsin Chu (TW)

( * ) Notice: Subject to any disclaimer, the term of this patent is extended or adjusted under 35 U.S.C. 154(b) by 0 days.

(21) Appl. No.: 10/655,706

(22) Filed: Sep. 5, 2003

(65) Prior Publication Data

US 2005/0051864 A1 Mar. 10, 2005

(51) Int. Cl.⁷ .......................... H01L 21/76; H01L 21/44

(52) U.S. Cl. ...................................... 438/652; 438/421

(58) Field of Search .................................. 438/411, 432, 438/421, 619–627, 652; 257/750–758

(56) References Cited

U.S. PATENT DOCUMENTS

| 6,130,151 A | * 10/2000 | Lin et al. ..................... 438/411 |
| 6,214,719 B1 | 4/2001 | Nag ........................... 438/619 |
| 6,303,464 B1 | * 10/2001 | Gaw et al. ................... 438/422 |

* cited by examiner

*Primary Examiner*—Cuong Nguyen
(74) *Attorney, Agent, or Firm*—MacPherson Kwok Chen & Heid LLP; David S. Park

(57) ABSTRACT

A method for controlling the position of air gaps in inter-metal dielectric layers between conductive lines and a structure formed using such a method. A first dielectric layer is deposited over at least two features and a substrate and an air gap is formed between the at least two features and above the feature height. The first dielectric layer is etched between the at least two features to open the air gap. Then a second dielectric layer is deposited over the etched first dielectric layer to form an air gap between the at least two features and completely below the feature height.

31 Claims, 3 Drawing Sheets

CONTROL OF AIR GAP POSITION IN A DIELECTRIC LAYER

BACKGROUND OF THE INVENTION

1. Field of Invention

The present invention generally relates to semiconductor processing. More particularly, the present invention relates to forming low dielectric constant structures including air gaps during semiconductor device fabrication.

2. Discussion of the Related Art

As device dimensions continue to shrink, intra-level line-to-line capacitance increasingly dominates over interlevel capacitance, and thus, it becomes increasingly important to implement low dielectric constant (k) schemes between tightly spaced metal lines. Reducing the capacitance between the interconnect metal lines on an integrated circuit chip will enhance the speed of the device and reduce extraneous signal energy (cross-talk) from traversing from one metal line to another.

Although air gaps formed between metal lines during dielectric deposition have been found to reduce the intra-level capacitance, they present a number of integration and reliability issues that must be addressed. In particular, the use of air gaps presents the issue of physical compromise of the air gap during subsequent processing, such as in chemical mechanical polish (CMP) or via formation. If air gaps extend above the metal lines, then the air gaps will be opened during subsequent CMP. Even if the CMP does not remove enough dielectric to reach an air gap directly, the normal and shear forces during CMP may create enough stress to compromise the interconnect structure.

Furthermore, a problem with depositions over metal lines formed with non-uniform line spacings is that an air gap formed between wider-spaced lines during the same deposition will be positioned higher than between narrower-spaced lines. There is also the possibility of forming a low quality "seam" that continues through the deposition even after the air gap has pinched off, which can lead to structural compromise.

Therefore, what is needed is a method for accurate control of the air gap height relative to the height of features above a substrate to ensure air gap integrity during subsequent processing such as CMP and via formation.

SUMMARY

The present invention provides a structure with controlled positions of air gaps in dielectric material between adjacent conductive and/or non-conductive features, such as metal lines, and a method for manufacturing such a structure.

According to an embodiment of the present invention, a method of forming a dielectric film including an air gap is provided, including forming a first dielectric layer, removing a portion of the first dielectric layer, and forming a second dielectric layer over the remaining first dielectric layer to form an air gap.

According to another embodiment of the present invention, a method of forming a dielectric film including an air gap is provided, including providing at least two features over a substrate, wherein the at least two features have a feature height and are separated by a feature spacing. The method further includes depositing a first dielectric layer over the at least two features and the substrate, wherein an air gap is formed between the at least two features and above the feature height. The first dielectric layer is etched between the at least two features to open the air gap, and a second dielectric layer is deposited over the etched first dielectric layer. An air gap is formed between the at least two features and completely below the feature height.

According to another embodiment of the present invention, a method of forming a low-k dielectric layer is provided, including providing at least three features over a substrate, wherein the at least three features have a feature height and are separated from one another by different feature spacings. A first dielectric layer is deposited over the at least three features and the substrate to a thickness above the feature height substantially of the smallest feature spacing. A first air gap is formed above the feature height of a first pair of features having a first feature spacing, and a second air gap is formed below the feature height of a second pair of features having a second feature spacing. The first dielectric layer is etched between the features to open the first and second air gaps. A second dielectric layer is deposited over the etched first dielectric layer to a thickness between the features of at least the feature height. A third air gap is formed between the first pair of features and completely below the feature height of the first pair of features, and a fourth air gap is formed between the second pair of features and completely below the feature height of the second pair of features.

According to yet another embodiment of the present invention, a semiconductor structure is provided, including at least three features over a substrate, wherein the at least three features have a feature height and are separated from one another by different feature spacings. The structure further includes a dielectric layer between the at least three features having a thickness of at least the feature height. A first air gap is in the dielectric material between a first pair of features having a first feature spacing, and a second air gap is in the dielectric material between a second pair of features having a second feature spacing. The first and second air gaps are completely below the feature height at different heights above the substrate.

Advantageously, the present invention allows for controlled positioning of air gaps in intermetal dielectric layers to provide stable isolation structures with low capacitance.

These and other features and advantages of the present invention will be more readily apparent from the detailed description of the embodiments set forth below taken in conjunction with the accompanying drawings.

BRIEF DESCRIPTION OF DRAWINGS

Use of the same reference symbols in different figures indicates similar or identical items. It is further noted that the drawings may not be drawn to scale.

DETAILED DESCRIPTION

FIGS. 1–6 illustrate a process sequence utilizing a deposition-etch-deposition method to form a dielectric structure including air gaps between and below the height of features over a substrate, for example lines, in accordance with one embodiment of the present invention. Advantageously, the present invention allows for dielectric structures to be formed with low dielectric constant and structural integrity to improve circuit speed.

Figure 1:
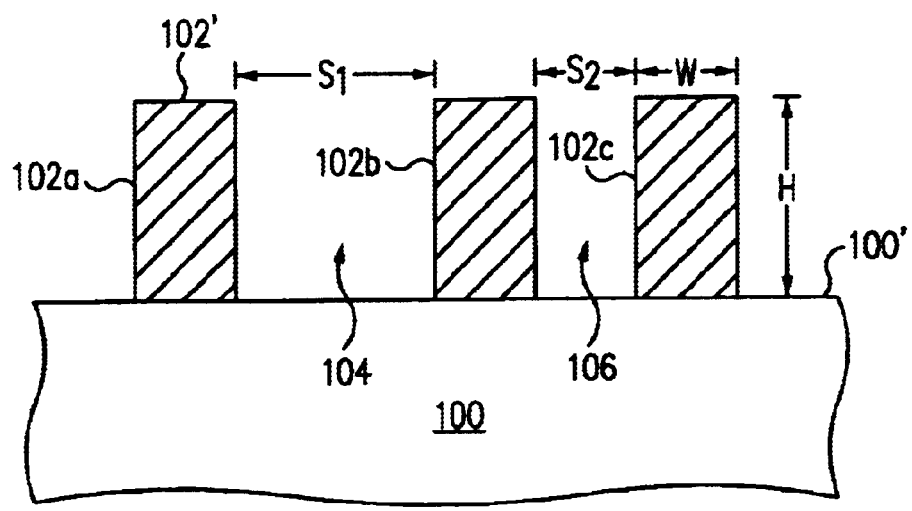
FIG. 1 illustrates a cross-section view of features formed over a semiconductor substrate.

FIG. 1 illustrates a cross-section view of one example of a substrate 100 which is a portion of a semiconductor device structure on which the present invention may be used. Substrate 100 may be doped by conventional means with dopants at different dosage and energy levels to form wells. Substrate 100 may be a wafer formed from a single crystalline silicon material or it may also comprise other suitable materials, for example, an epitaxial material or a polycrystalline semiconductor material. Substrate 100 can also include additional layers, structures, and/or devices. If the substrate is layered, it may have metal connections exposed to provide electrical contact with the next layer to be subsequently formed.

As further shown in FIG. 1, lines 102a, 102b, and 102c are formed over substrate 100 and trenches 104 and 106 are formed therebetween bounded by the respective lines and surface 100' of substrate 100. In one embodiment, with no intent to limit the invention thereby, lines 102a–102c are conductor lines comprising polysilicon formed by chemical vapor deposition (CVD) or aluminum formed by physical vapor deposition (PVD). It is noted that lines 102a–102c may be formed of other appropriate metals, such as copper or titanium, by known techniques.

In another embodiment, with no intent to limit the invention thereby, lines 102a–102c are silicon nitride lines to be eventually replaced with metal lines in a damascene scheme. The nitride lines may be eventually removed using a wet-etch process or other appropriate etching process after dielectric structures including air gaps are formed between the nitride lines in accordance with the present invention. A metal is then deposited to replace the nitride lines.

A layer of material (e.g., metal or silicon nitride) may be patterned and etched into a line-space geometry pursuant to design rules. The etching may be performed by any of the etch methods for metal, silicon nitride, or polysilicon known to one skilled in the art. However, it should be apparent that lines 102a, 102b, and 102c may be formed of various suitable materials by various suitable methods.

Trench 104 formed between lines 102a and 102b has a line spacing $S_1$ and trench 106 formed between lines 102b and 102c has a line spacing $S_2$. In the embodiment illustrated in FIG. 1, line spacing $S_1$ of trench 104 is wider than line spacing $S_2$ of trench 106. However, the present invention encompasses having line spacings $S_1$ and $S_2$ which are equal in distance or in different configurations of line spacings. In one example, with no intent to limit the invention thereby, line spacing $S_1$ is between about 0.6 $\mu$m and about 1.5 $\mu$m, and line spacing $S_2$ is between about 0.1 $\mu$m and about 0.6 $\mu$m.

Each of the lines also has an associated height H and width W. Line height H is measured from substrate surface 100' to a line top surface 102'. In one example, with no intent to limit the invention thereby, lines 102a–102c have a height H between about 3,000 Å and about 10,000 Å, and a width W between about 0.1 $\mu$m and about 1.0 $\mu$m. In a further example, the lines have the same height. It is noted that the invention is not limited to the substrate being planar or lines having the same height.

In an alternative embodiment, lines 102a–102c are part of the substrate and/or covered by a thin film to thereby form features protruding above the substrate with different spacings between the features. The present invention can be used with such a structure to form a dielectric layer including air gaps between and below the height of such features. It is evident that the present invention can be used with general features protruding above the substrate to control air gap positioning between the features. It is noted that a line, as described above, is a feature which is longer than its width and is not necessarily straight but may follow various paths. Further, a pair of lines includes at least a segment of one of the lines which is parallel to at least a segment of the other line but need not necessarily have the same line spacing throughout the entire line pair.

Figure 2:
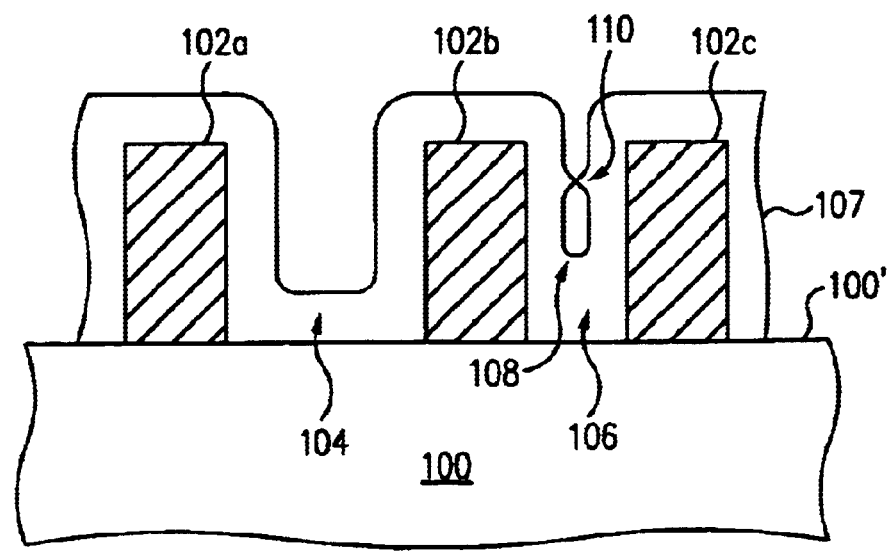
FIG. 2 illustrates a cross-section view of the structure illustrated in FIG. 1 after a dielectric material is deposited forming an air gap between narrower-spaced features, in accordance with an embodiment of the present invention.
Figure 3:
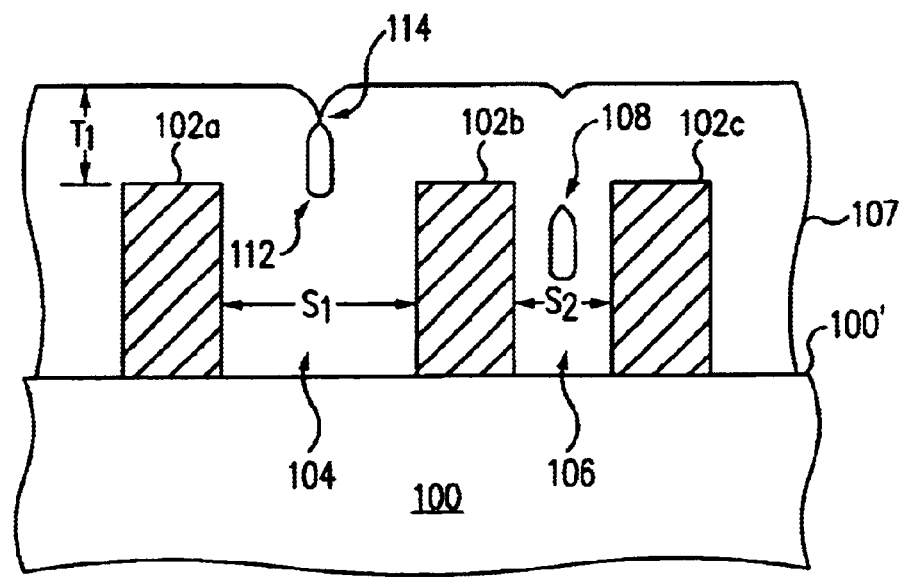
FIG. 3 illustrates a cross-section view of the structure illustrated in FIG. 2 after the dielectric material is further deposited over the topography, forming an air gap between and above the height of the wider-spaced features, in accordance with an embodiment of the present invention.

Referring now to FIGS. 2 and 3, a dielectric layer 107 is formed over the topography of the structure illustrated in FIG. 1 and fills trenches 104 and 106. FIG. 2 shows the beginning stages of deposition during which an air gap 108 is formed between lines 102b and 102c. FIG. 3 illustrates further deposition of dielectric material to complete formation of dielectric layer 107, during which an air gap is formed between and above the height of the wider-spaced lines 102a and 102b.

Chemical vapor deposition (CVD) is often used to fill high aspect ratio trenches (defined by the trench height divided by the trench width) with a dielectric material. Typical CVD processes employing high density plasma (HDP) with a gas mixture containing active and inert gases achieves simultaneous dielectric etching and deposition. In an HDP-CVD process, an RF bias is applied to a wafer substrate in a reaction chamber. Some of these gas molecules are ionized in the plasma and accelerate toward the wafer surface when the RF bias is applied to the substrate. Material on the wafer is thereby sputtered (i.e., removed) when the heavy ions strike the surface. As a result, dielectric material deposited on the wafer surface is simultaneously sputter etched, usually to help keep trenches open during the deposition process.

The relationship between the concurrent dielectric layer deposition and etching that occurs in the HDP-CVD process can be expressed as an etch-to-deposition (E/D) ratio. If the E/D ratio is decreased, facets begin moving away from the corners, and cusps begin to form on sidewalls of the trench because the etching rate is not high enough to keep the trench open for filling. At a certain point in the process, the cusps will meet and prevent further deposition below the cusps. When this occurs, a void or air gap is created in the dielectric layer.

Redeposition of sputtered material also occurs when dielectric material is etched during CVD. Redeposition occurs by two main mechanisms: backscattering from the ambient above the substrate and hitting an element on the substrate in a line-of-sight path. Some of the etched dielectric material is redeposited on sidewall surfaces through these two mechanisms (i.e., the material sputtered from the bottom between the lines is redeposited on the sidewalls), even though most of the etched dielectric is emitted back into the plasma and pumped out of the reaction chamber. As the distance between sidewall surfaces decreases (i.e., as aspect ratio increases), an increased percentage of sputtered material is redeposited.

Accordingly, higher aspect ratio trenches result in voids forming earlier in time and below the height of the lines due to cusp formation closing the trench opening. As discussed above, this is due mainly to the shortened line-of-sight path between opposing sidewalls for higher aspect ratio gaps. Therefore, with varying line spaces between lines, air gaps are formed higher above the substrate as line spacing increases.

In one embodiment, dielectric layer 107 is formed by high density plasma chemical vapor deposition (HDP-CVD) but may be formed by various applicable deposition processes. For example, dielectric layer 107 may be deposited by low pressure chemical vapor deposition ("LPCVD"), plasma enhanced chemical vapor deposition ("PECVD"), rapid thermal chemical vapor deposition ("RTCVD"), or other applicable techniques.

In one embodiment, dielectric layer 107 is conformally deposited over lines 102a–102c and substrate surface 100'. Dielectric layer 107 has an initial thickness above the height of the lines substantially measuring the minimum line spacing (if there are three or more lines involved) or the line spacing (if there are only two lines involved). Accordingly, dielectric layer 107 will be of different thickness based upon the line spacing(s) between the lines. In one example, with no intent to limit the invention thereby, the initial thickness of dielectric layer 107 may be on the order of about 6,000 Å above the line height for lines having a height of about 9,000 Å and a minimum line spacing of about 0.6 μm. In other embodiments, dielectric layer 107 may have an initial thickness greater than the minimum line spacing (if there are more than two lines) or the line spacing (if there are only two lines) provided that air gaps are formed. In one example, the dielectric layer may have an initial thickness of one-half the largest line spacing.

Dielectric layer 107 may comprise materials suitable for insulating semiconductor elements such as silicon dioxide or low-k material such as commercially available Black Diamond™ and SiLK™. In one example, dielectric layer 107 may comprise silicon dioxide formed from reaction gases such as tetraethylorthosilicate (TEOS) and oxygen, or silicon dioxide formed from reaction gases such as silane ($SiH_4$), oxygen ($O_2$), and helium (He).

In one embodiment, the HDP-CVD process is performed using a source radio frequency (RF) for generating radicals and with low or zero bias power applied to the substrate. Low bias power prevents damage to substrate 100 potentially caused by etching/sputtering. In one example, with no intent to limit the invention thereby, dielectric layer 107 is formed of TEOS using the following parameters: no bias power is applied to the substrate, and high frequency power of about 0.5 kilowatts and low frequency power of about 0.4 kilowatts is applied to form plasma at a process pressure of about 2.4 torr and a process temperature of about 350° C.

As shown in FIG. 2, during the deposition process, a first air gap is formed in trench 106 as cusps 110 meet and prevent further deposition directly below the cusps. As shown in FIG. 3, a second air gap 112 is formed as cusps 114 meet and prevent further deposition directly below the cusps.

It is evident that second air gap 112 is formed higher above the surface of substrate 100 than first air gap 108 because line spacing $S_1$ between lines 102a and 102b is wider than line spacing $S_2$ between lines 102b and 102c. In one embodiment, dielectric layer 107 is deposited to have a thickness $T_1$ above the height of the lines, wherein thickness $T_1$ is substantially the length of line spacing $S_2$ between lines 102b and 102c when $S_2$ is the minimum line spacing of interest.

Figure 4:
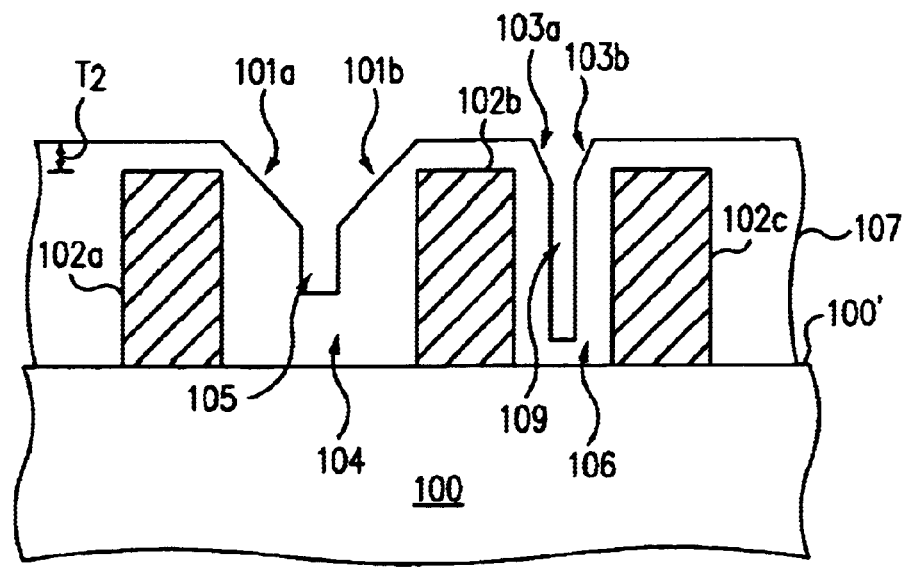
FIG. 4 illustrates a cross-section view of the structure illustrated in FIG. 3 after the dielectric material is etched to open the air gaps, in accordance with an embodiment of the present invention.

Referring now to FIG. 4, an etch step follows the deposition step to open air gaps 108 and 112 (FIG. 3) formed within dielectric layer 107 between the lines. In one embodiment, dielectric layer 107 is etched to have a thickness $T_2$ above the lines, wherein thickness $T_2$ is about 20% of $T_1$. In other words, about 80% of the initial deposit of dielectric layer 107 above the lines is etched and removed.

As air gaps 108 and 112 have different heights above the surface of substrate 100 due to differences in line spacing, the etch step produces a trench within the dielectric layer having a depth in direct relationship to the height of the air gap. Dielectric trenches 105 and 109 are formed with higher aspect ratios than trenches 104 and 106, respectively, and with trench openings below the line height. The combination of the higher aspect ratios and lower trench openings allows for air gaps to be subsequently formed below the height of the lines.

The etch step may be performed by conventional wet etch or dry etch methods, such as by using a conventional diluted HF solution or BOE solution, in one example. However, because of the ability of dry etch processes to etch anisotropically (in comparison to wet etch processes, which etch isotropically), dry etching is preferably used to etch dielectric layer 107 and thereby open air gaps 108 and 110. Different types of dry etch processes may be utilized: those that have a physical basis (e.g., ion beam milling), those that have a chemical basis (e.g., non-plasma assisted chemical etching), and those that combine both physical and chemical mechanisms (e.g., reactive ion etching and some types of plasma-assisted etching). Chemically enhanced ion etching processes that combine the two mechanisms are preferred.

Accordingly, in one embodiment, the method of the present invention utilizes a single dry etch step involving simultaneous ion bombardment and polymerizing chemistry to etch dielectric layer 107 thereby opening air gaps 108 and 110. In other embodiments, the dielectric etch may be split into multiple etch steps, for example a main etch and an overetch, both of which involve a physical and chemical component of varying degree to allow for a dielectric etch that is highly anisotropic. The degree of anisotropy, as well as other factors such as the etch rate, are determined by a variety of parameters. These parameters include the quantity of power supplied to produce the plasma, the type and flow rate of etchant gas used to etch the dielectric, and the pressure within the reaction chamber.

As further shown in FIG. 4, sloped surfaces 101a, 10b and 103a, 103b related to dielectric trenches 105 and 109, respectively, are formed between the lines at the top surface of etched dielectric layer 107. Sloped surfaces 101a, 101b are more tapered than sloped surfaces 103a, 103b in direct relationship to line spacing (i.e., surfaces are more tapered with increased line spacing). The sloped surfaces end at vertical sidewalls of trenches 105 and 109 (i.e., the trench openings), which begin below the line height. Advantageously, because of the etch step, high aspect ratio trench 105 is formed after opening air gap 114 (FIG. 3) which was above the line height. High aspect ratio trench 105 allows for an air gap to eventually form in trench 104 below the line height, whereas trench 104 had a lower aspect ratio and thus could not contain air gap 114 below the line height.

Figure 5:
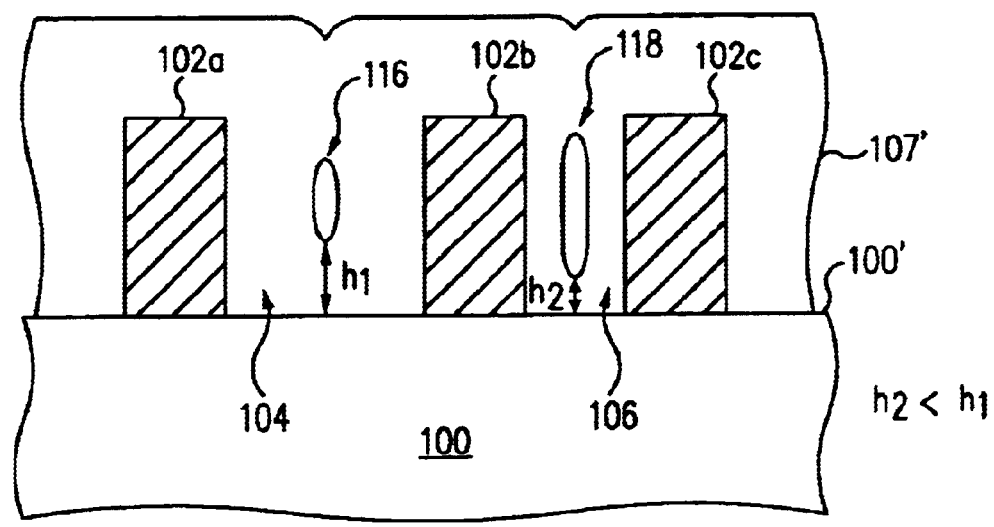
FIG. 5 shows a cross-section view of the structure illustrated in FIG. 4 after a dielectric material is deposited over the etched dielectric material forming air gaps between and below the height of the features, in accordance with an embodiment of the present invention.

Referring now to FIG. 5, a dielectric material is deposited over the topography of the etched dielectric layer 107 (FIG. 4) and forms dielectric layer 107' to completely cover trenches 104 and 106. Similar to the formation of dielectric layer 107, dielectric layer 107' is formed by high density plasma chemical vapor deposition (HDP-CVD) but may be formed by various applicable deposition processes. For example, dielectric layer 107' may be formed by low pressure chemical vapor deposition ("LPCVD"), plasma enhanced chemical vapor deposition ("PECVD"), rapid thermal chemical vapor deposition ("RTCVD"), or other applicable techniques.

In one embodiment, dielectric layer 107' fills the trenches 104 and 106 to at least the line height. In one example, with no intent to limit the invention thereby, the thickness of dielectric layer 107' may be on the order of about 7,000 Å above the line height, and is preferably between about 6,000 Å and about 8,000 Å above the line height. However, the exact thickness of dielectric layer 107' is determined by the requirements of the given device geometry and critical dimensions. Preferably, dielectric layer 107' has a minimum thickness that is above the line height to preserve the air gaps and insulate the lines.

Dielectric layer 107' is conformally deposited in accordance with an embodiment of the present invention. Dielectric layer 107' may comprise materials suitable for insulating semiconductor elements such as silicon dioxide or low-k materials as previously noted. In one example, dielectric layer 107' may comprise silicon dioxide formed from reaction gases such as TEOS and oxygen, or silicon dioxide formed from reaction gases such as silane ($SiH_4$), oxygen ($O_2$), and helium (He).

In one embodiment, the HDP-CVD process is again performed using a source radio frequency (RF) for generating radicals with low or zero bias power being applied to the substrate. Low bias power prevents damage to substrate 100 potentially caused by etching/sputtering. In one example, with no intent to limit the invention thereby, the same parameters as in the first dielectric deposition step is applied to form dielectric layer 107'. No substrate bias power is applied, and high frequency power of about 0.5 kilowatts and low frequency power of about 0.4 kilowatts is applied to form plasma at a process pressure of about 2.4 torr and a process temperature of about 350° C.

As shown in FIG. 5, during the deposition process, an air gap 116 is formed within trench 105 (FIG. 4) and ultimately within trench 104 as cusps meet and prevent further deposition directly below the cusps. An air gap 118 is formed within trench 109 (FIG. 4) and ultimately within trench 106 as cusps meet and prevent further deposition directly below the cusps. In other embodiments, air gaps 116 and 118 may be formed between dielectric layers 107 and 107'.

Referring again to FIG. 5, air gaps 116 and 118 have different heights above the substrate in direct relationship to the trench width or line spacing. Thus, air gaps begin higher above the substrate with increasing trench width or line spacing. Accordingly, air gap 116 in trench 104 begins a height $h_1$ above substrate surface 100' and air gap 118 in trench 106 begins a height $h_2$ above substrate surface 100', where $h_1$ is greater than $h_2$.

The deposition-etch-deposition method of the present invention allows for air gap 116 to be formed lower in trench 104 than during the first deposition step because of high aspect ratio trench 105 that is formed within the dielectric layer during the etch step, thereby allowing for air gap formation below the height of the lines during the second deposition step.

Table 1 below provides process parameter ranges in accordance with one embodiment to form air gaps between and completely below the height of the lines. In one specific example, the deposition of dielectric layers 107 and 107' is performed in a TEOS deposition chamber commercially available from Novellus Systems, Inc. of San Jose, Calif. In another specific example, the etch of dielectric layer 107 is performed in a commercially available etch chamber from Applied Materials Corporation of Santa Clara, Calif. However, one having ordinary skill in the art will realize that the values will vary depending on the make and model of the deposition and etch chambers used in the process and the geometry of lines involved. Although specific examples of deposition and etch chambers are provided above, a typical plasma processing chamber may be used in accordance with the present invention to deposit and/or etch the dielectric layers.

TABLE 1

| Process Parameter | Deposition 1 | Etch | Deposition 2 |
| --- | --- | --- | --- |
| TEOS Flow Rate (sccm) | 2,100 | n/a | 2,100 |
| $O_2$ Flow Rate (sccm) | 9,500 | n/a | 9,500 |
| Ar Flow Rate (sccm) | n/a | 50–250 | n/a |
| $CF_4$ Flow Rate (sccm) | n/a | 10–100 | n/a |
| $CHF_3$ Flow Rate (sccm) | n/a | 10–100 | n/a |
| Plasma Forming/ Low Frequency Power (W) | 400 | 20–1,200 | 400 |
| Plasma Forming/ High Frequency Power (W) | 500 | n/a | 500 |
| Wafer Biasing Power (W) | 0 | 500–2,000 | 0 |
| Process Pressure (mTorr) | 2,400 | 50–300 | 2,400 |
| Process Temperature (° C.) | 350 | 15 | 350 |

In one example of a typical plasma processing chamber, a chamber is provided housing a chamber electrode powered by a first power source, such as a radio frequency (RF) power source. Typically, a gas port is provided within the chamber and is arranged for releasing gaseous source materials, e.g., the etchant source gases, into the RF-induced plasma region. The gaseous source materials may be released from ports built into the walls of the chamber itself or through a shower head.

In one embodiment, a wafer is introduced into the chamber and disposed on a chuck or pedestal, which acts as a bottom electrode and may be biased by a second power source. The chuck may be, in one example, an electrostatic chuck, which secures substrate 100 to the chuck's surface by electrostatic force.

By applying power to the chamber electrode, a plasma may be created within the chamber by causing the molecules of one or more of the inflowing gases to disassociate into respective submolecular constituents (e.g., free radicals or free ions). Power is applied to the electrostatic chuck or pedestal to attract ionized molecules in the plasma toward the wafer surface for sputter etching.

An exhaust port is typically disposed on one side of the chamber and coupled to a pump typically located outside of the chamber. The pump maintains the desired pressure inside the chamber.

Further, the reactor may be controlled by a programmable computer that is programmed to automate the processing of the wafer, including transfer of wafers to and from loading modules, and delivery of process gas and electrode power.

In preparation for the etch of dielectric layer 107, a first gas flow is circulated through the reaction chamber. The first gas flow includes a first fluorocarbon component and optionally includes an inert gas component. The first fluorocarbon component aids in the anisotropic etching of the dielectric material to leave a sloped profile at the top of the trenches formed within the dielectric material.

In one embodiment of the present invention, the first fluorocarbon component includes $CF_4$ and $CHF_3$. The flow rate of $CF_4$ in the first gas flow is between about 10 sccm and about 100 sccm and is preferably about 15 sccm. $CF_4$ comprises between about 5% and about 45% total concentration by volume of the first gas flow. The flow rate of $CHF_3$ in the first gas flow is between about 10 sccm and about 100 sccm and is preferably about 45 sccm. $CHF_3$ comprises between about 5% and about 45% total concentration by volume of the first gas flow.

In one embodiment, the inert gas component is argon. Argon helps to increase the uniformity of the plasma and etch process by acting as a diluent. Also, argon is ionized and aids in anisotropic etching because of its relatively large atomic weight. In one embodiment, the flow rate of argon may be between about 50 sccm and about 250 sccm and is preferably about 150 sccm. Argon comprises between about 50% and about 90% total concentration by volume of the first gas flow.

Other combinations of component and inert gases may be used for the etch step in accordance with the present invention, as will be apparent to those of ordinary skill in the art. As some examples, a combination of $C_4F_8/O_2/Ar$, or $C_4F_6/O_2/Ar$, or $CsF_8/O_2/Ar$ may also be used.

For the etch step, the process pressure within the reaction chamber is set at between about 50 mT and about 300 mT, and is preferably set at about 200 mT. As previously described for one embodiment, a vacuum means, such as a mechanical pump, is provided to exhaust gases from the reaction chamber and to thereby create the desired pressure within the chamber.

The pressure and gas flow into the reaction chamber are maintained at the selected levels for a time sufficient to allow for stabilization of the gas flow rates and reaction chamber pressure. Once the environment within the reaction chamber is sufficiently stabilized, the electrodes of the reaction chamber are powered, a first plasma is formed within the reactor chamber, and the etch step is performed to form dielectric trenches 105 and 109 with respective sloped surfaces 101a, 101b and 103a, 103b, as shown in FIG. 4.

In the etch step, the wafer is set on an electrode static chuck with backside helium (He) flow to cool down the wafer temperature. The bias power that biases the wafer to attract ionic species to strike the substrate surface is set at between about 500 W and about 2000 W and is preferably set at about 1000 W.

The bombardment of ions from the plasma, in conjunction with the diffusion of chemically reactive species from the plasma to the topography of substrate 100 for polymer deposition and carbon accumulation allows dielectric layer 107 to be etched in a highly directional manner.

Various factors affect the etch step. The $CF_4$ component is used as an etchant source gas to form $CF_3^+$ and fluorine radicals that are responsible for ionic bombardment on the substrate. Argon radicals together with $CF_3^+$ radicals are both heavy on the scale of molecular weight and can maximize the bombardment energy delivered to the substrate surface for a highly anisotropic etch. Since ion bombardment is inversely related to the process pressure, ion bombardment increases as the process pressure is lowered due to decreased scattering disturbance in the course of ion trajectories. The converse is true when process pressure is increased. On the other hand, increasing the power applied to the plasma etcher for formation of the plasma increases the ion bombardment component of the etch due to increased formation of the plasma radicals that are involved in the ion bombardment. The converse is true when the power applied to the etcher is decreased.

The etch step is preferably continued until the top surfaces of dielectric layer 107 are substantially within 20% of the starting thicknesses above the lines. In other words, the etching step removes about 80% of the initial deposit of the dielectric layer above the lines. The etch step may be discontinued using endpoint detection mechanisms such as laser interferometry, which can provide signals for endpoints and etch byproducts. Upon completion of the required etching, the supply of power to the electrodes of the reaction chamber is discontinued.

Figure 6:
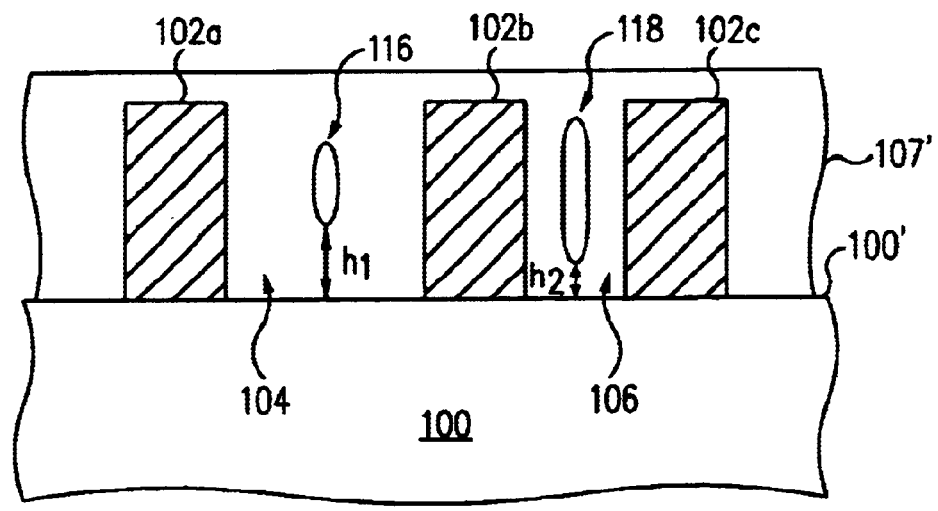
FIG. 6 shows a cross-section view of the structure illustrated in FIG. 5 after the dielectric material is planarized, in accordance with an embodiment of the present invention.

As shown in FIG. 6, dielectric layer 107' is planarized downward to leave a substantially level surface of dielectric layer 107' preferably above the lines while keeping air gaps 116 and 118 intact. In one example, chemical mechanical planarization (CMP) is performed to remove top portions of dielectric layer 107'.

The above-described embodiments of the present invention are merely meant to be illustrative and not limiting. Various changes and modifications may be made without departing from this invention in its broader aspects. For example, the invention is not limited to the aforementioned dimensions but will involve various layer thicknesses depending upon the performance of subsequent planarization steps and/or desired critical dimensions required of the fabricated structures. Accordingly, the invention is not limited to particular structures, dimensions, or process parameters. Therefore, the appended claims encompass all such changes and modifications as falling within the true spirit and scope of this invention.

What is claimed is:

1. A method of forming a dielectric film including an air gap, comprising:
   providing at least two features over a substrate, wherein the at least two features have a feature height and are separated by a feature spacing;
   forming a first dielectric layer over the at least two features and the substrate, the first dielectric layer having a thickness above the feature height substantially of the feature spacing;
   removing a portion of the first dielectric layer; and
   forming a second dielectric layer over the remaining first dielectric layer to form an air gap.

2. The method of claim 1, wherein the first dielectric material comprises silicon oxide or a low-k dielectric material deposited by chemical vapor deposition.

3. The method of claim 1, wherein the first and second dielectric layers are comprised of the same material or different material.

4. The method of claim 1, wherein the air gap is formed between the first and second dielectric layers.

5. The method of claim 1, wherein the air gap is formed within the feature spacing and below the feature height of the two features.

6. The method of claim 1, wherein the two features are lines having at least a segment of one of the lines parallel to at least a segment of the other line.

7. The method of claim 1, wherein the first dielectric is removed to have a thickness above the feature height of about 20% of the feature spacing.

8. The method of claim 1, wherein the feature spacing is between about 0.1 μm and about 0.6 μm.

9. A method of forming a dielectric film including an air gap, comprising:
providing at least two features over a substrate, wherein the at least two features have a feature height and are separated by a feature spacing;
depositing a first dielectric layer over the at least two features and the substrate, wherein an air gap is formed between the at least two features and above the feature height;
etching the first dielectric layer between the at least two features to open the air gap; and
depositing a second dielectric layer over the etched first dielectric layer, wherein an air gap is formed between the at least two features and completely below the feature height.

10. The method of claim 9, wherein the two features are lines having at least a segment of one of the lines parallel to at least a segment of the other line.

11. The method of claim 9, wherein the at least two features are comprised of a conductive material.

12. The method of claim 11, wherein the conductive material is selected from the group consisting of metal and polysilicon.

13. The method of claim 9, wherein the at least two features are comprised of silicon nitride.

14. The method of claim 9, wherein the feature height is between about 3,000 Å and about 10,000 Å.

15. The method of claim 9, wherein the feature spacing is between about 0.1 $\mu$m and about 0.6 $\mu$m.

16. The method of claim 9, wherein the first dielectric layer is deposited to have a thickness above the feature height substantially of the feature spacing.

17. The method of claim 9, wherein the first dielectric layer comprises silicon oxide or a low-k dielectric material deposited by chemical vapor deposition.

18. The method of claim 9 wherein the first dielectric layer is etched to a thickness above the feature height of about 20% of the feature spacing.

19. The method of claim 9, wherein the etching is performed using a mixture selected from the group consisting of $CHF_3/CF_4/Ar$, $C_4F_8/O_2/Ar$, $C_4F_6/O_2/Ar$, and $C_5F_8/O_2/Ar$.

20. The method of claim 19, wherein the etching is performed using a mixture including about 45 sccm of $CHF_3$, about 15 sccm of $CF_4$, and about 150 sccm of Ar at a process pressure of about 200 mT.

21. The method of claim 9, wherein the etching forms a trench in the first dielectric layer having an aspect ratio higher than the trench bounded by the at least two features over the substrate.

22. The method of claim 9, wherein the second dielectric layer is deposited to have a thickness between the at least two features of at least the feature height.

23. The method of claim 9, wherein the second dielectric layer comprises silicon oxide from tetraethylorthosilicate deposited by chemical vapor deposition.

24. The method of claim 9, further comprising planarizing the second dielectric layer to a level above the feature height.

25. A method of forming a low-k dielectric layer, comprising:
providing at least three features over a substrate, wherein the at least three features have a feature height and are separated from one another by different feature spacings;
depositing a first dielectric layer over the at least three features and the substrate to a thickness above the feature height substantially of the smallest feature spacing, wherein a first air gap is formed above the feature height of a first pair of features having a first feature spacing, and wherein a second air gap is formed below the feature height of a second pair of features having a second feature spacing;
etching the first dielectric layer between the features to open the first and second air gaps; and
depositing a second dielectric layer over the etched first dielectric layer to a thickness between the features of at least the feature height, wherein a third air gap is formed between the first pair of features and completely below the feature height of the first pair of features, and wherein a fourth air gap is formed between the second pair of features and completely below the feature height of the second pair of features.

26. The method of claim 25, wherein the at least three features are lines with a pair of the lines having at least a segment of one of the lines in the pair parallel to at least a segment of the other line in the pair.

27. The method of claim 25, wherein the first feature spacing is between about 0.6 $\mu$m and about 1.5 $\mu$m.

28. The method of claim 25, wherein the second feature spacing is between about 0.1 $\mu$m and about 0.6 $\mu$m.

29. The method of claim 25, wherein the first dielectric layer is etched to a thickness above the feature height of about 20% of the smallest feature spacing.

30. The method of claim 25, wherein the third and fourth air gaps have different heights above the substrate.

31. The method of claim 25, wherein the first pair of features has a wider feature spacing than the second pair of features, and the third air gap formed between the first pair of features is higher above the substrate than the fourth air gap formed between the second pair of features.

* * * * *

UNITED STATES PATENT AND TRADEMARK OFFICE
CERTIFICATE OF CORRECTION

PATENT NO.        : 6,881,668 B2
APPLICATION NO.   : 10/655706
DATED             : April 19, 2005
INVENTOR(S)       : Tai-Peng Lee, Ching-Yueh Hu and Chuck Jang It is certified that error appears in the above-identified patent and that said Letters Patent is hereby corrected as shown below:

In Col. 9, line 27, it should read: --$C_5F_8/O_2/Ar$-- instead of "$CsF_8/O_2/Ar$".

Signed and Sealed this

Fifteenth Day of April, 2008

JON W. DUDAS
*Director of the United States Patent and Trademark Office*